United States Patent [19]

Wang et al.

[11] Patent Number: 5,659,568
[45] Date of Patent: Aug. 19, 1997

[54] LOW NOISE SURFACE EMITTING LASER FOR MULTIMODE OPTICAL LINK APPLICATIONS

[75] Inventors: Shih-Yuan Wang, Palo Alto; Michael R. Tan, Menlo Park; Andreas Weber, Redwood City; Kenneth H. Hahn, Cupertino, all of Calif.

[73] Assignee: Hewlett-Packard Company, Palo Alto, Calif.

[21] Appl. No.: 447,657

[22] Filed: May 23, 1995

[51] Int. Cl.$^6$ ............................................. H01S 3/19
[52] U.S. Cl. .................................. 372/96; 372/46
[58] Field of Search .......................... 372/45, 46, 96; 437/128

[56] References Cited

U.S. PATENT DOCUMENTS

| | | | |
|---|---|---|---|
| 5,256,596 | 10/1993 | Ackley et al. | 372/45 |
| 5,274,655 | 12/1993 | Shieh et al. | 373/46 |
| 5,328,854 | 7/1994 | Vakshoori et al. | 437/128 |
| 5,359,447 | 10/1994 | Hahn et al. | 359/154 |

OTHER PUBLICATIONS

N. K. Dutta, et al., Digital Transmission Link Using Surface Emitting Lasers and Photoreceivers, Jul. 31, 1995, App. Phys. Lett. 67 (5), pp. 588–589.

Author not indicated, 90% Coupling of Top Surface Emitting GaAs/AlGaAs Quantum Well Laser Output Into 8μm Diameter Core Silica Fibre, Sep. 13, 1990, Electronics Letters, vol. 26, No. 19, pp. 1628–1629.

G. Reiner, et al., Optimization of Planar Be–Doped In GaAs VCSEL.'s with Two–Sided Output, Jul. 7, 1995, IEEE Photonics Technology Letters, vol. 7, No. 7, pp. 730–732.

R. S. Geels, et al., Design & Characterization of $In_{0.2}Ga_{0.8}As$ MQW Vertical–Cavity Surface–Emitting Lasers, Dec. 1993, vol. 29, No. 12, IEEE Journal of Quantum Electronics, pp. 2977–2987.

Fiedler, U. et al., "Design of VCSEL's for Feedback Insensitive . . . " IEEE Jou. Sel. Sel Top. Quan. Elec. 1(2), Jun. 1995, pp. 442–449.

Tauber, D. et al., "Large and small dynamics of vertical cavity surface emitting lasers", Appl. Phys. Lett. 62(4), Jan. 24, 1993 pp. 325–327.

Hahn, K.H., Tan, M.R., Wang, S. Y., "Intensity Noise of Large Area Vertical Cavity Surface Emitting Lasers in Multimode Optical Fibre Links',"Electronics Letters, Nov. 11, 1993.

Siegman, Anthony E., "Lasers", University Science Books, Mill Valley, California, Jun. 15, 1992, pp. 473–478.

Kuchta, Danial M. et al., "Relative Intensity Noise of Vertical Cavity Surface Emitting Lasers", Applied Physics Letters, vol. 62, No. 11, Mar. 15, 1993, pp. 1194–1196.

*Primary Examiner*—Rodney B. Bovernick
*Assistant Examiner*—Yisun Sang
*Attorney, Agent, or Firm*—Denise A. Lee

[57] ABSTRACT

The present invention provides a low noise multimode VCSEL that can be used to transmit data reliably on multimode optical media at data rates up to and exceeding 1 gigabit per second with bit error rates less than $1\times10^{-9}$ errors/bit. In contrast to conventional multimode lasers where optimal mirror reflectivity is designed for maximum power output, in the present invention mirror reflectivity is increased to a point where the output power is less than half the maximum output power. Preferably, the reflectivity of the first and second mirror regions of the multimode laser is high, typically greater than 99.5%.

13 Claims, 9 Drawing Sheets

LOW NOISE SURFACE EMITTING LASER FOR MULTIMODE OPTICAL LINK APPLICATIONS

BACKGROUND OF THE INVENTION

The present invention relates generally to optical transmission systems and more particularly to an optical communication network including a low noise surface emitting laser being operated in multiple transverse modes or multiple filamentation.

Optical communication systems, used to carry information from one location to another, are comprised of at a minimum, three elements: (1) a transmitter that generates a beam of light and modulates the beam with data to be transmitted, (2) a receiver that receives the beam of light and recovers data from it, and (3) a medium such as an optical fiber that carries the beam of light from the transmitter to the receiver. Light may travel through an optical medium in a single mode or in multiple modes.

Multiple mode operation has generally been understood to consist of multiple modes in one laser cavity. However, multiple mode operations can occur with filamentation due to non-uniform gain or loss. This is specially true for laser with a large transverse dimension compared with the wave length. For convenience, the terms "multiple mode" and "multimode" as used herein to describe the laser operation will include both multiple mode in a single laser cavity and multiple filamentation.

A given optical medium may be capable of supporting many modes or only a single mode. This is determined by physical dimensions and parameters of the optical medium—in the case of an optical fiber—the diameter of the fiber and the difference between the indices of refraction of the core and the cladding.

Optical communication systems using multimode fibers (MMF) are subject to degradation in its performance caused by such parameters as intermodal dispersion, and modal noise due to mode selective losses (MSL). Intermodal dispersion becomes worse as the fiber length increases. Since intermodal dispersion only affects multimode fibers, single mode fiber (SMF) systems are preferred for long distances.

Figure 1A:
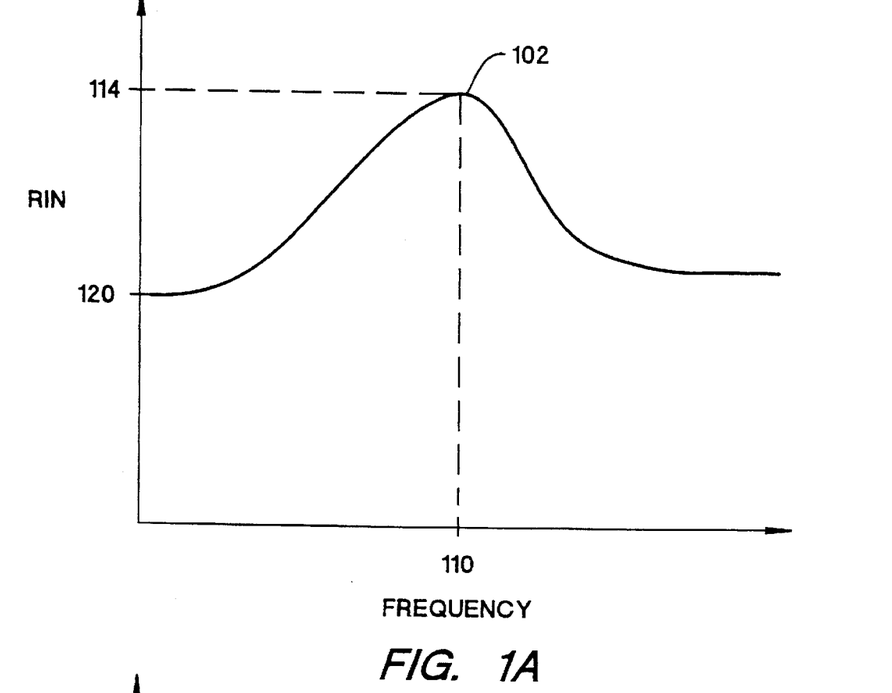
FIG. 1A shows a graphical representation of relative intensity noise (RIN) versus frequency for an optical communication system including a single mode laser.
Figure 1B:
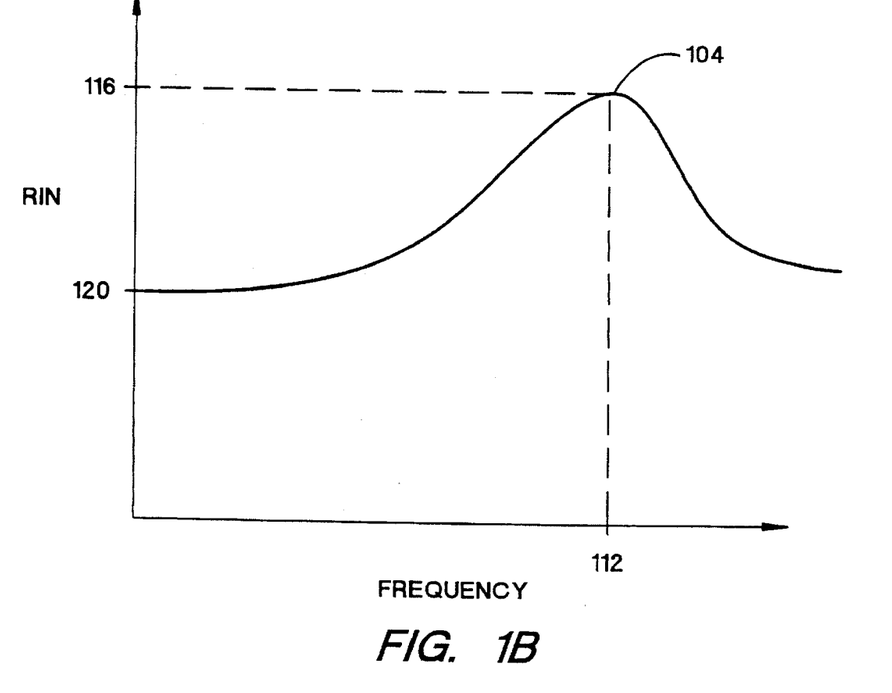
FIG. 1B shows a graphical representation of RIN versus frequency for an optical communication system including a single mode laser having a higher reflectivity than the laser in FIG. 1A with all the other laser parameters remaining the same.

FIGS. 1A and 1B plot relative intensity noise (RIN) versus frequency for an optical communication system using single mode fiber and a laser operating in single mode. The relaxation oscillation of a laser is the characteristic modulation frequency of the laser and is proportional to the square root of the photon density in the cavity. The relaxation oscillation of curve 102 is noted by point 110 on the frequency axis of FIG. 1A. The relaxation oscillation of curve 104 is noted by point 112 on the frequency axis of FIG. 1B. The peak of the relative intensity noise (RIN) occurs at the relaxation frequency and is noted by points 114 and 116 for FIGS. 1A and 1B respectively.

Comparing the lasers of FIG. 1A and FIG. 1B, the laser in FIG. 1B has a mirror reflectivity greater than the mirror reflectivity of FIG. 1A at the same current bias. (Reflectivity is defined as the geometric mean reflectivity of both mirrors unless specifically stated as the reflectivity of a specific mirror.) Since the photon density is higher for the laser in FIG. 1B compared to the laser in FIG. 1A, the relaxation oscillation of the laser in FIG. 1B is also higher than the relaxation oscillation of the laser in FIG. 1A. The article "Relative intensity noise of vertical cavity surface emitting lasers", D. M. Kuchta et. al., Appl. Phys. Lett 62, 15 Mar. 1993, pp 1194–1196, describes the relationship between relative intensity noise and mirror reflectivity for a single mode laser.

Assuming the same current densities, although the laser represented by curve 104 has a higher relaxation frequency, it is less efficient than the laser of curve 102. Typically lasers are designed for high efficiency where the ratio of power (optical)/Power(electrical) is made as large as possible. High efficiency requires designing the laser with optimized output power. Lasers are typically designed for high efficiency to minimize excess heat generation which can deteriorate laser performance.

Multimode optical fiber is used in short distance optical links (<10 kilometers) due to the low cost of the components. Multiple mode fibers are preferred because the relative ease of packaging and alignment makes MMF systems considerably less expensive than single mode fiber systems. For communicating over distances of less than a few hundred meters, existing optical communication systems have used multimode fibers for the local area.

Figure 2A:
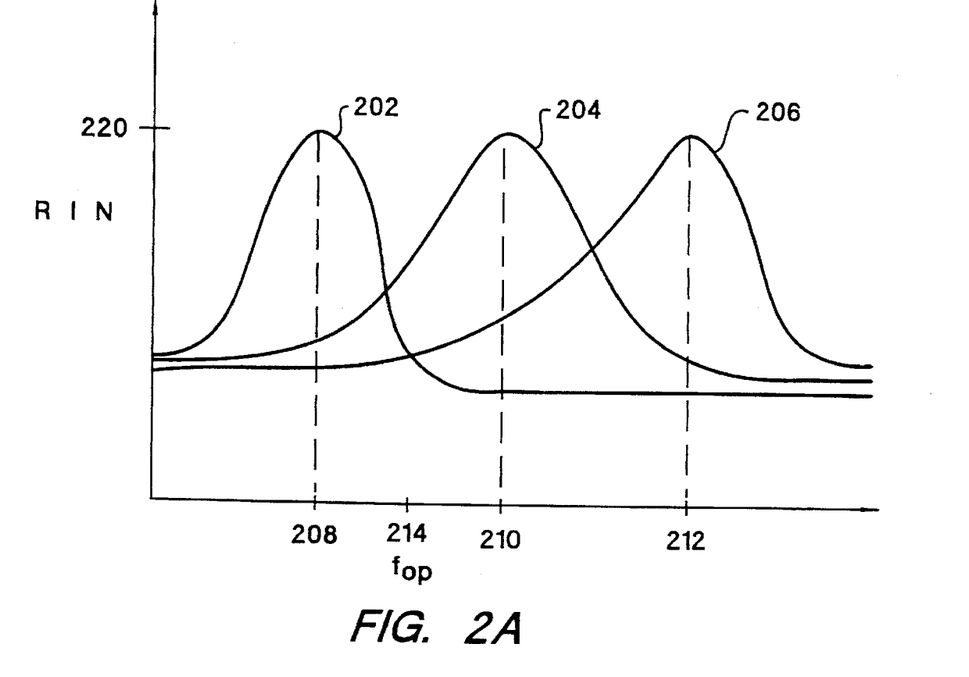
FIG. 2A shows a graphical representation of RIN versus frequency for different mode/filament curves for a multimode laser in an optical communication system if the RIN of each mode/filament can be resolved separately.
Figure 2B:
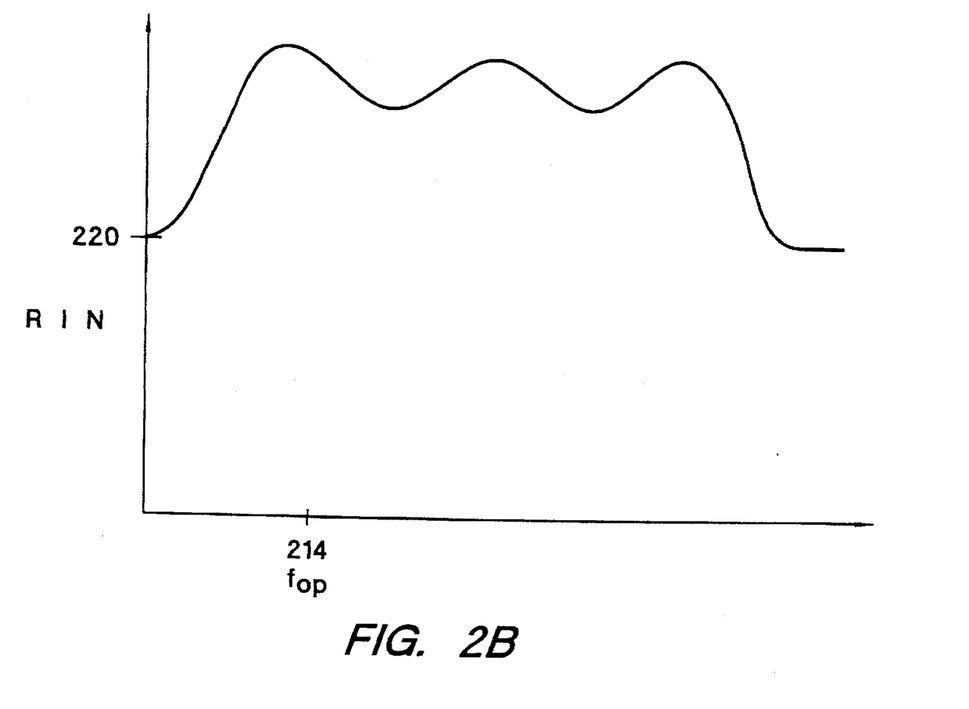
FIG. 2B shows a graphical representation of RIN versus frequency for the multimode laser of FIG. 2A where the curve shown in FIG. 2B is the summation of the different mode/filament curves of FIG. 2A.

Multimode lasers typically have higher RIN than single mode lasers. FIGS. 2A and 2B show a graphical representation of relative intensity noise (RIN) versus frequency for an optical communication system using multimode fiber and a vertical cavity surface emitting laser (VCSEL) operating in multiple mode/filaments. Multimode lasers tend to exhibit multiple relaxation oscillation frequencies and have multiple RIN peaks. For example, the three curves 202, 204, 206 shown in FIG. 2A each represent the relaxation frequency for a different mode of the multimode laser. The RIN of the multimode laser shown in FIG. 2B is a composite of the sum of curves 202, 204, 206. The multimode laser's RIN is the summation of the different modal/filament RIN of the laser, the RIN for the multimode laser is typically higher than the RIN for a single mode laser. Comparing the curves of FIGS. 1A and 1B to FIG. 2B, the RIN labeled 120 in FIGS. 1A and 1B in general is less than the RIN labeled 220 in FIG. 2B for lasers with the same output power. Also, because the RIN for the multimode laser is a summation of curves, RIN tends to be a more complex waveform that is less predictable than the RIN waveform for a single mode laser.

From the foregoing it will be apparent that a low noise, high speed, and economical way to transmit data at data rates exceeding one gigabit per second by means of optical communication systems using a multimode laser to transmit data is needed.

SUMMARY OF THE INVENTION

The present invention provides a low noise multimode VCSEL that can be used to transmit data reliably on multimode optical media at data rates up to and exceeding 1.0 gigabit/sec with bit error rates less than $1\times10^{-9}$ errors/bit. The low noise multimode surface emitting laser comprised of an active region, a first Bragg mirror region having a first conductivity type, and a second Bragg mirror region having a second conductivity type. In contrast to conventional lasers where optimal mirror reflectivity is designed for maximum power output and therefore high efficiency, in the present invention mirror reflectivity is increased to a point where the output power is less than half the maximum output power. The reflectivity of the first and second mirror regions of the multimode laser is high, typically greater than 99.9% for the highest reflectivity mirror and greater than 99.5% for the output mirror.

Increasing the mirror reflectivity decreases RIN, decreases laser sensitivity to back reflection, reduces output power to meet eye safety requirements, and reduces the laser power dissipation. Typically the high reflectivity of the mirror regions is achieved by increasing the number DBR (Distributed Bragg Reflector) pairs to increase the Q (Quality Factor of Resonant Cavity). It should be noted that each mode/filament of the multimode laser has an associated Q. Increasing the Q of the laser cavity results in a high photon density in the cavity moving the relaxation oscillations of each mode/filament at a given output power to a higher frequency. With the relaxation frequency at higher frequencies than the VCSEL operating frequency, the high Q multimode laser will exhibit lower RIN at the operating frequency.

In addition, with the increase in reflectivity of the DBR mirrors, the threshold of the various spatial mode/filaments will be reduced, encouraging the spatial modes/filaments to form at a lower bias. Therefore at a given output power a high Q surface emitting laser has a wider envelope of spectral width. This is advantageous for large area VCSELs for use in multimode fiber links where wide envelope spectral width is required such that the system is less sensitive to modal noise. Hence, increasing reflectivity (R) will decrease RIN and will increase the envelope of the spectral width (due to operation of the individual filaments and the higher order modes). The spectral envelope width contains many individual line widths of modes and filaments.

An advantage of high reflectivity mirror regions is that high reflectivity increases the relaxation frequencies to a higher frequency resulting in a lower RIN at the operating frequency at a reduced bias current resulting in a quieter laser. Also the ratio of the change in photon density in the cavity to the change in current will be larger and hence the relaxation oscillations will move out to higher frequencies with a given bias increase. RIN better than −130 dB/Hz have been observed for a multimode laser at 622 Mb/sec. In general, the VCSEL of the present invention will achieve a lower RIN at a lower bias to satisfy a BER of less than $10^{-12}$ errors/bit than a similarly constructed SEL without high reflectivity mirrors. RIN of less than −116 dB/Hz at 532 Mb/s (fiber channel standards) can be achieved for a bias current of less than 10 mA.

For a reflectivity R larger than necessary for the maximum laser output, the low output power decreases with further increasing R. For eye safety reasons in the optical link environment, the output power of the VCSEL is kept at <1 mW at 980 nm.

Another advantage of increasing the reflectivity of the output cavity R is the reduction in sensitivity of the laser to back reflection. Reflections into the VCSEL can cause the laser to de-stabilize causing fluctuations in the laser output power. Increasing R causes less light to re-enter the cavity and since the cavity has a higher internal field, sensitivity to back reflection is decreased.

In conventional single mode or multimode VCSEL structures, the boundary of the proton isolation region formed in the top mirror region stops before or coincides with the sidewalls of the electrode formed on the surface of the top mirror region. The proton isolation regions, introduce regions of high resistance in the VCSEL causing current flow to be directed primarily to regions without proton implantation. The proton implantation is used to constrict the current flow to optimize the overlap of the optical field and the electrically pumped active region. The proton implanted region is optically lossy.

As previously noted, each mode or filament of the multimode laser has an associated Q. In conventional multimode VCSEL structures the Q for each mode is different, especially for the modes near the boundary of the optical lossy regions. It is desirable that all the modes/filaments of the multimode laser have similar Q such that the relaxation oscillation can be uniformly extended to higher frequencies. Applicant believes that by positioning the optical lossy regions so that they do not interfere with the outermost modes of the lasers, more similar Qs for each of the different modes of the multimode laser can be achieved. For a bottom emitting VCSEL, this occurs when the lateral dimensions of the optical cavity is less than the lateral spacing between the optical lossy regions.

In order to prevent the optically lossy regions in the VCSEL from interfering with the pattern of emitted light, in the present invention the optically lossy regions are extended beyond the lateral boundaries of the optical cavity. However, placing the optical lossy regions too far from the current flow path will result in wasted current and increased heat dissipation. It is preferable to terminate the boundary of the optically lossy region approximately two to four microns before the boundary of the optical cavity. This ensures that modes near the boundary of the sidewalls of the electrode will not suffer high optical loss which could result in a lower Q for modes near the edge than for modes near the center of the top electrode. In the case of a bottom emitting VCSEL, the sidewalls of the optical cavity is approximately aligned with the sidewalls of the top electrode. Thus, the proton isolation regions should be placed approximately two to four microns from the boundary of the electrode sidewalls.

In a first embodiment, the multimode VCSEL is a bottom emitting laser comprised of first and second Bragg mirror regions and an active region, the first and second mirror regions having a high reflectivity. In a first embodiment, the top surface of the optically lossy region coincides with the top surface of the second Bragg mirror region. An electrode, typically a gold mirror, is formed on the top surface of the second Bragg mirror. In a second embodiment, the top surface of the optically lossy region coincides with a first surface and the electrode is formed on a second surface, where the second surface is positioned above the first surface, the second surface being generally parallel to the first surface.

The method of making the multimode laser according to the present invention includes the steps of: forming a first mirror region on a substrate; forming an active region on a first surface of the first mirror region; forming a second mirror region on the surface of the active region, such that the active region is positioned between the first mirror region and the second mirror region, wherein the reflectivity of the first mirror and the second mirror regions are designed to result in an output power of the multimode vertical cavity laser that is less than half the maximum output power. To achieve an output power that is less than half the maximum output power, the reflectivity of the first and second mirror regions is typically greater than 99.5%.

A further understanding of the nature and advantages of the present invention may be realized with reference to the remaining portions of the specification and the attached drawings.

DETAILED DESCRIPTION OF THE PREFERRED EMBODIMENTS

Figure 3:
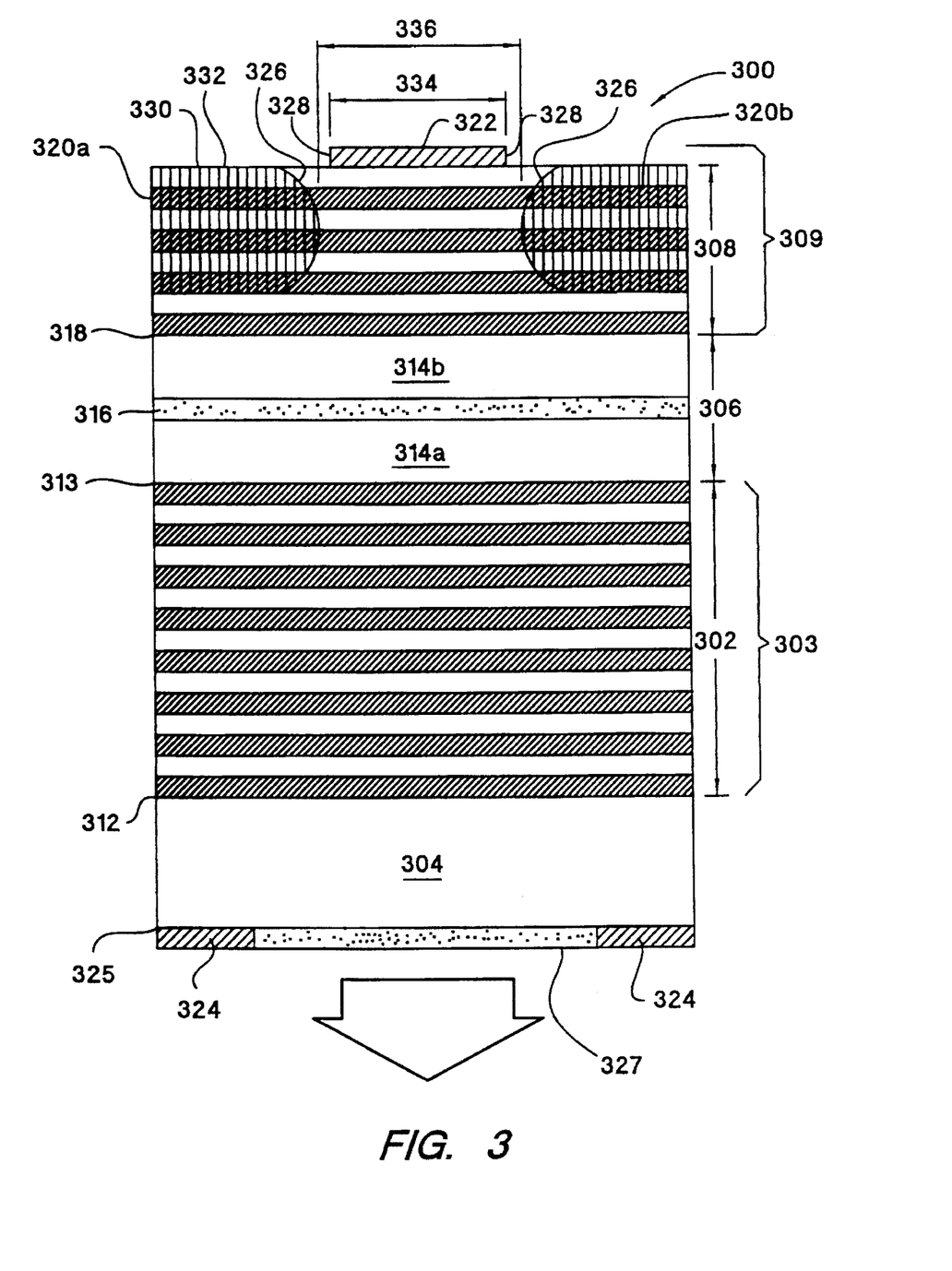
FIG. 3 shows a cross-sectional view of a bottom emitting multimode VCSEL structure according to a first embodiment of the present invention.

FIG. 3 shows a cross-sectional view of a bottom emitting multimode VCSEL 300 according to a first embodiment of the present invention. The multimode VCSEL 300 includes a first Bragg mirror region 302 grown on a n substrate 304, an active region 306, and a second Bragg mirror region 308 including proton isolation regions 320. Preferably, the VCSEL 300 is grown on an n+ GaAs (gallium arsenide) substrate. The GaAs substrate 304 is doped with an n-type dopant, preferably silicon, and has a silicon dopant concentration typically in the range of $5 \times 10^{17}$ to $5 \times 10^{19}$ atoms/cm$^3$.

The Bragg mirror regions 302, 308 and the active region 306 are formed using techniques well known in the art. The first Bragg mirror region 302 is grown on a first surface 312 of the substrate 304 and is typically constructed from alternating quarter-wave layers having different indices of refraction. The alternating quarter-wave layers are typically constructed of AlAs and GaAs. The interface between the layers may be graded using an AlAs/GaAs/Al$_{0.3}$Ga$_{0.7}$As variable duty cycle short period superlattice to reduce any heterojunction band discontinuities at the GaAs/AlAs interface.

Typically, multimode lasers are designed to provide the maximum power output. The maximum power output is typically also defined as the optimal power. The textbook Lasers, by A. Siegman, pages 473–479 discusses laser output power. In contrast to conventional multimode lasers where mirror reflectivity is designed for optimal power output, in the present invention mirror reflectivity is increased so that the output power is less than half the optimal power. Preferably, the mirror reflectivity is increased so that the output power is less than 10% of the optimal power.

Figure 4:
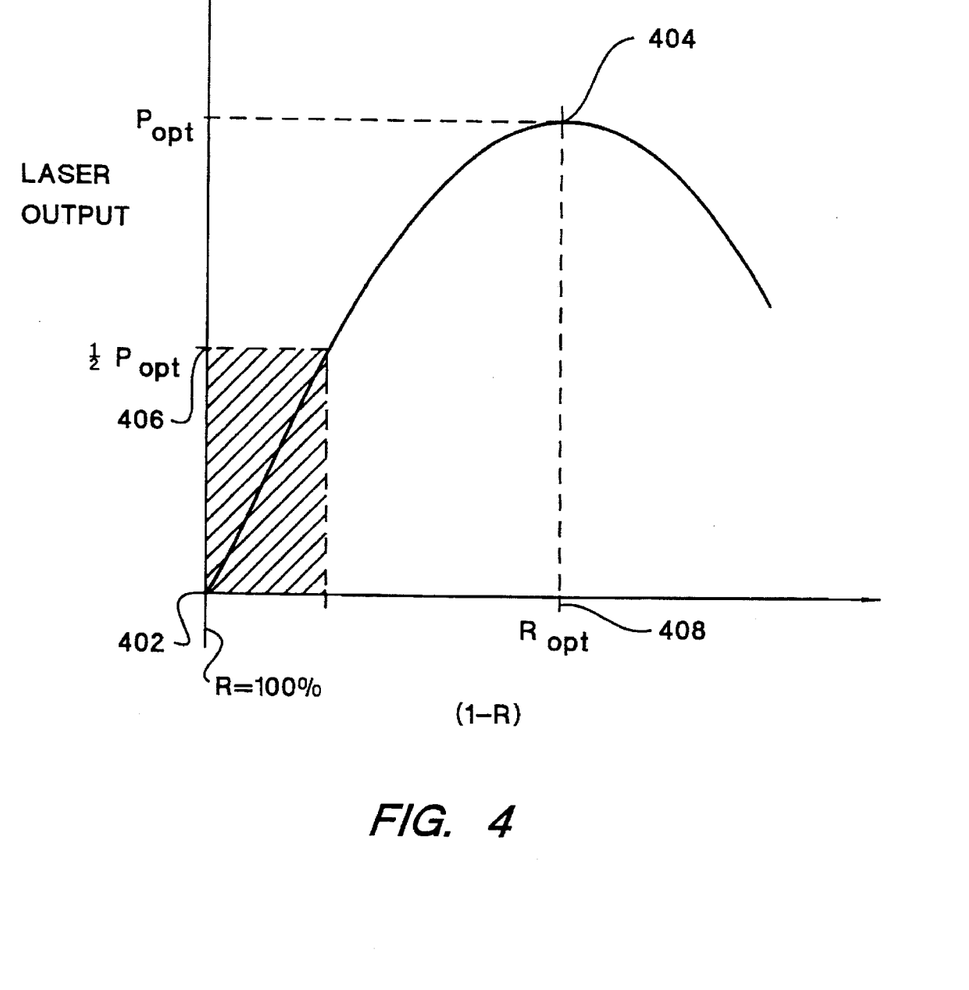
FIG. 4 shows a graphical representation of the laser output power versus reflectivity.

Referring to FIG. 4 shows a graphical representation of the laser output power versus reflectivity. The x axis represents (1–R) where R is the total cavity reflectivity. Thus, the origin (point 402) represents 100% reflectivity. The y axis represents the laser output power. The point 404 represents the optimal power output of the laser and point 406 on the y axis represents ½ the optimal power output of the laser. In conventional lasers, the reflectivity of the multimode laser is designed around point 408. In the present invention, the reflectivity of the multimode laser is designed so that the output power is less than ½ the optimal power.

To achieve the output power required for the multimode VCSEL according to the present invention, the reflectivity of the first and second mirror regions 303, 309 is high, typically greater than 99.5%. In the preferred embodiment in FIG. 3, the first mirror region 303 (the output mirror) has a reflectivity typically around 99.8%. The reflectivity of 99.8% for the first mirror region (the output mirror) is true for the bottom emitting structure. For the top emitting structure shown in FIG. 8, the first mirror region has a reflectivity typically greater than 99.9% and the second mirror is the output mirror with a reflectivity of greater than 99.5%. To achieve this reflectivity, typically the first Bragg mirror region 302 is comprised of 21.5 or more pairs of alternating GaAs/AlAs quarter-wave layers having a n-dopant concentration in the range of $10^{17}$ to $10^{19}$ atoms/cm$^3$.

After formation of the first Bragg mirror 302, the active region 306 of the VCSEL 300 is formed on a first surface 313 of the active region 306. The active region 306 typically includes an n-cladding layer 314a, a quantum well region 316, and a p-cladding layer 314b. The cladding layers 314a, 314b are preferably constructed of Al$_{0.3}$Ga$_{0.7}$As doped in the range of 1 to $10 \times 10^{18}$ atoms/cm$^3$. The quantum well region 316 is constructed of one or more MQWs of strained In$_{0.2}$Ga$_{0.8}$As (indium gallium arsenide) having a thickness of approximately 60 to 80 angstroms with gallium arsenide barriers having a thickness of approximately 80 to 100 angstroms.

The second Bragg mirror region 308 is formed on the top surface 318 of the active region 306. Similar to the first Bragg mirror 302, the second Bragg mirror 308 is comprised of alternating quarter-wave layers having different indices of refraction, however, the second Bragg mirror 308 is p-doped. The reflectivity of the second Bragg mirror is high, typically around 97%–98%. To achieve this high reflectivity, the second Bragg mirror region 308 includes typically between 15 to 20 pairs of alternating layers of AlAs doped with carbon C or beryllium (Be). The alternating layers have a dopant concentration of $1 \times 10^{19}$ atoms/cm$^3$ and GaAs doped with C or Be. The interface between the alternating layers may be graded using an AlAs/GaAs/Al (0.3) Ga (0.7) As variable duty cycle short period superlattice to reduce any heterojunction band discontinuities at the GaAs/AlAs alternating layer interface.

As previously stated, the mirror reflectivity of the first mirror 303 and second mirrors 309 are designed to have a reflectivity greater than 99.5%. The first and second mirror regions 303, 309 may be comprised of a Bragg mirror alone or a Bragg mirror in combination with an electrode mirror. Referring to the embodiment shown in FIG. 3, the electrode 322 is preferably made of gold, a highly reflective material. Thus although the reflectivity of the second Bragg mirror 308 is approximately 97%–98%, the reflectivity of the second mirror region 309 (the combination of the reflectivity of the second Bragg mirror 308 and the reflectivity of the electrode mirror 322) is greater than 99%. Preferably, the reflectivity of the second mirror region 309 is 99.8%.

Figure 5A:
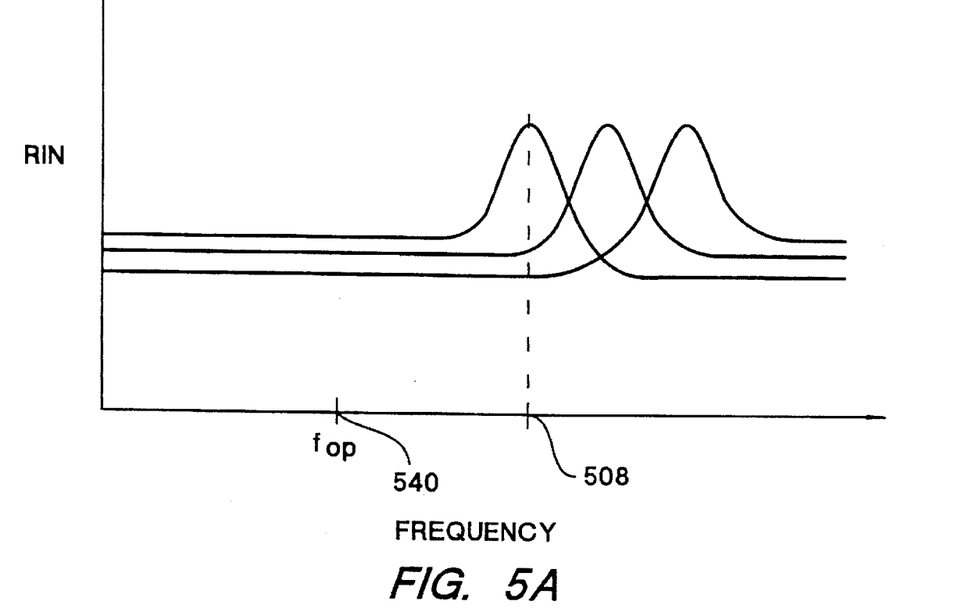
FIG. 5A shows a graphical representation of RIN versus frequency for different mode/filaments of a multimode laser according to the present invention in an optical communication system if RIN due to each mode/filament can be resolved separately.
Figure 5B:
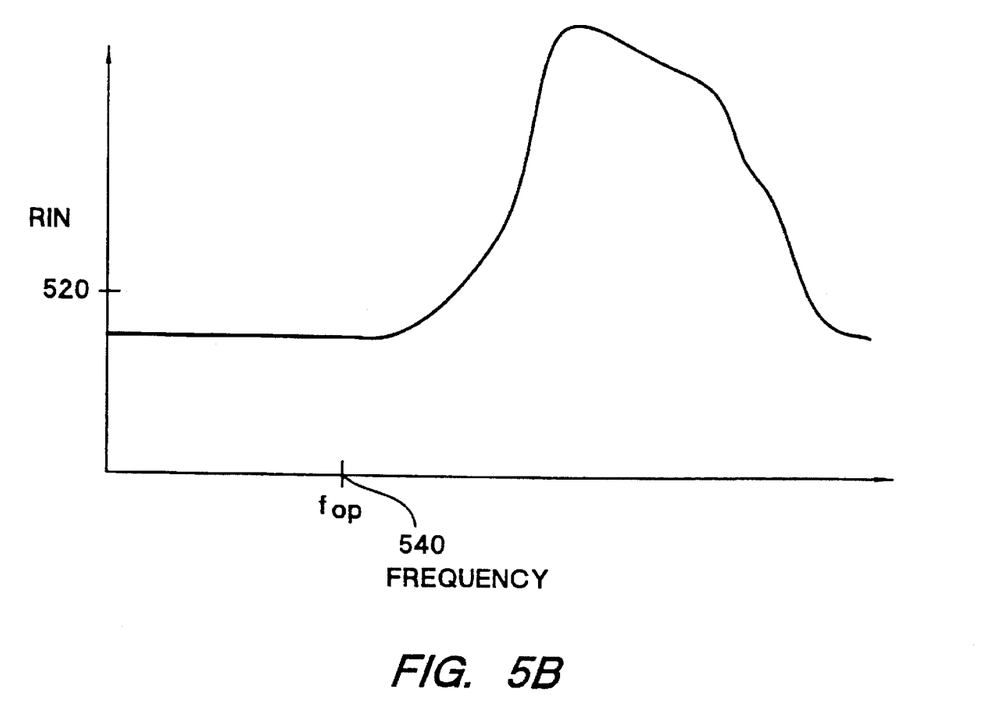
FIG. 5B shows a graphical representation of RIN versus frequency for the multimode laser of FIG. 5A where the curve shown in FIG. 5B is the summation of the mode/filament curves of FIG. 5A.

FIG. 5A shows a graphical representation of RIN versus frequency for different mode/filaments of a multimode laser according to the present invention. Compared to the conventional multimode laser whose operation is represented in FIGS. 2A and 2B, the multimode of the present invention has similar characteristics except that the vertical cavity surface emitting multimode laser of FIG. 5A has higher reflectivity than conventional multimode lasers. As previously stated, the reflectivity of both the first mirror region and the second mirror regions (for the embodiment represented by FIG. 5A and 5B) should be greater than 99.5%.

Applicant believes that increasing the mirror reflectivity increases the relaxation frequency. Thus, comparing FIGS. 2A and 5A, the first relaxation frequency 508 (the lowest relaxation oscillation frequency) shown in FIG. 5A is greater than the first relaxation frequency 208 of FIG. 2A. Further, Applicant believes that increasing the mirror reflectivity decreases RIN at the operating frequency. Since the relaxation oscillation frequency is greater than the operating frequency, the multimode laser of FIG. 5A and 5B can operate at data rates exceeding gigabits per second with low BER (less than $10^{-9}$ errors/bit). Further, at data rates of one gigabit per second, RIN is less than $-130$ dB/Hz, achieving an acceptable BER.

In the embodiment shown in FIG. 3, the optically lossy regions are proton isolation regions, although other optically lossy regions or alternatively highly resistive regions may be used instead of the optically lossy regions shown in FIGS. 3 and 5–8 which is induced by ion implantation of hydrogen. The proton isolation regions 320, which introduce regions of high resistance, are typically formed in the second Bragg mirror 308. An electrode 322 is formed on a first surface of the second Bragg mirror. Electrodes 324 are formed on the bottom surface 325 of the substrate 304. Typically, the aperture of the VCSEL greater than six microns is defined as a multimode laser and a VCSEL having an aperture of less than six microns is defined as a single mode VCSEL, although what is important for a multimode mode laser is the existence of multiple modes/filaments in the cavity.

Increasing the number of modes as with a multimode laser, increases the required opening of the aperture. Ending the proton isolation region boundary before the sidewalls of the electrode prevents the proton isolation region from interfering with the optical field of the outermost mode of the multimode laser so that the proton isolation regions do not cause excess loss to optical modes. If modes near the edge interact with the proton region significantly it can cause excess loss. The aperture of the laser is defined by the Au mirror 322 in this case.

In conventional multimode lasers the Q for each mode is different, especially near the boundary of the optical lossy regions. Applicant believes by moving the optically lossy regions so that they do not interfere with the outermost modes of the multimode laser, similar Qs for each of the different modes can be achieved. Thus, the lateral dimensions of the optical cavity should be made less than the spacing between the optical lossy regions. When this occurs, similar Qs occur for the multimode laser assuming uniform material parameters.

Figure 5C:
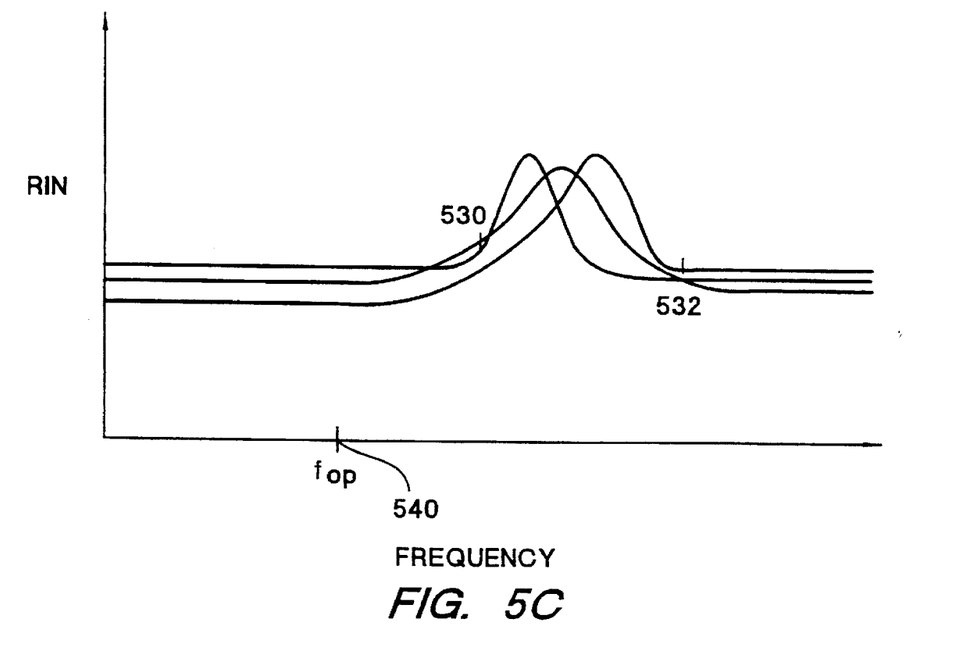
FIG. 5C shows a graphical representation of RIN versus frequency for different mode/filament curves of a multimode laser according to an alternative embodiment of the present invention if RIM due to each mode/filament can be resolved separately.
Figure 5D:
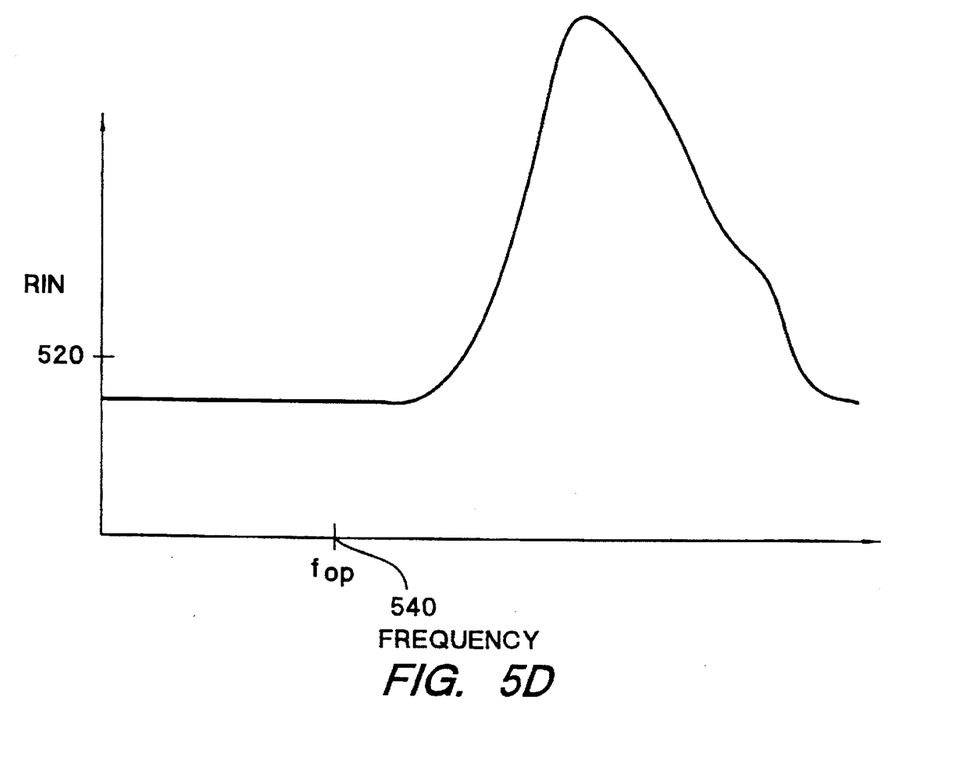
FIG. 5D shows a graphical representation of RIN versus frequency for the multimode laser of FIG. 5C where the curve shown in FIG. 5C is the summation of the mode/filament curves of FIG. 5C.

Referring to FIG. 2A, the differences in Q between the modes results in spread of the relaxation frequency oscillation of the different modes. Compared to the embodiment of the multimode laser shown in FIG. 5A having a high reflectivity, the embodiment of the multimode laser represented by FIG. 5C has high reflectivity to increase the relaxation oscillation frequency, but also has Qs more similar than the Qs shown in FIG. 5A. In FIG. 5C since the Qs of the different modes of the multimode laser are similar, the modal curves are bunched together with the originating and termination frequencies 530, 532 and waveform shapes being similar. Preferably, the origination frequencies of the different modes are less than 20 percent different in value. Although Applicant believes that although modal curves having similar Q are preferred, the modal frequency curves do not necessarily have to be bunched together. What is important is that the relaxation oscillation frequency peaks 508 are increased past the operating frequency 540 for a desired RIN at the operating frequency.

Although it is desirable to position the optically lossy region so that is does not interfere with filamentation of the outermost mode, placing the proton isolation too far before the electrode sidewalls results in inefficient current channeling. Balancing these criteria, it is preferable to terminate the proton isolation boundary approximately 2 to 4 microns before the sidewalls of the electrode boundary.

Imagine a plane parallel to the electrode sidewall boundary 328, the plane parallel to the electrode sidewall extending through the portion of the proton isolation region boundary 326 closest to the central axis of the electrode 322. In the embodiment shown in FIGS. 3 and 6, the heretofore described plane through the proton isolation region boundary 326 ends before a plane extending through the corresponding sidewall boundary 328 of the electrode 322. Preferably, the boundary 326 ends two to four microns before the corresponding boundary of the electrode sidewall. This is in contrast to conventional single mode or multimode VCSEL structures, where the boundary of the proton isolation region closest to the central axis of the electrode extends past or coincides with the sidewall boundaries of the electrode formed on the surface of the second Bragg mirror 308. Thus in conventional multimode and single mode VCSEL structures, the proton isolation region boundary 326 typically coincides with or is underneath the electrode 322.

Figure 6:
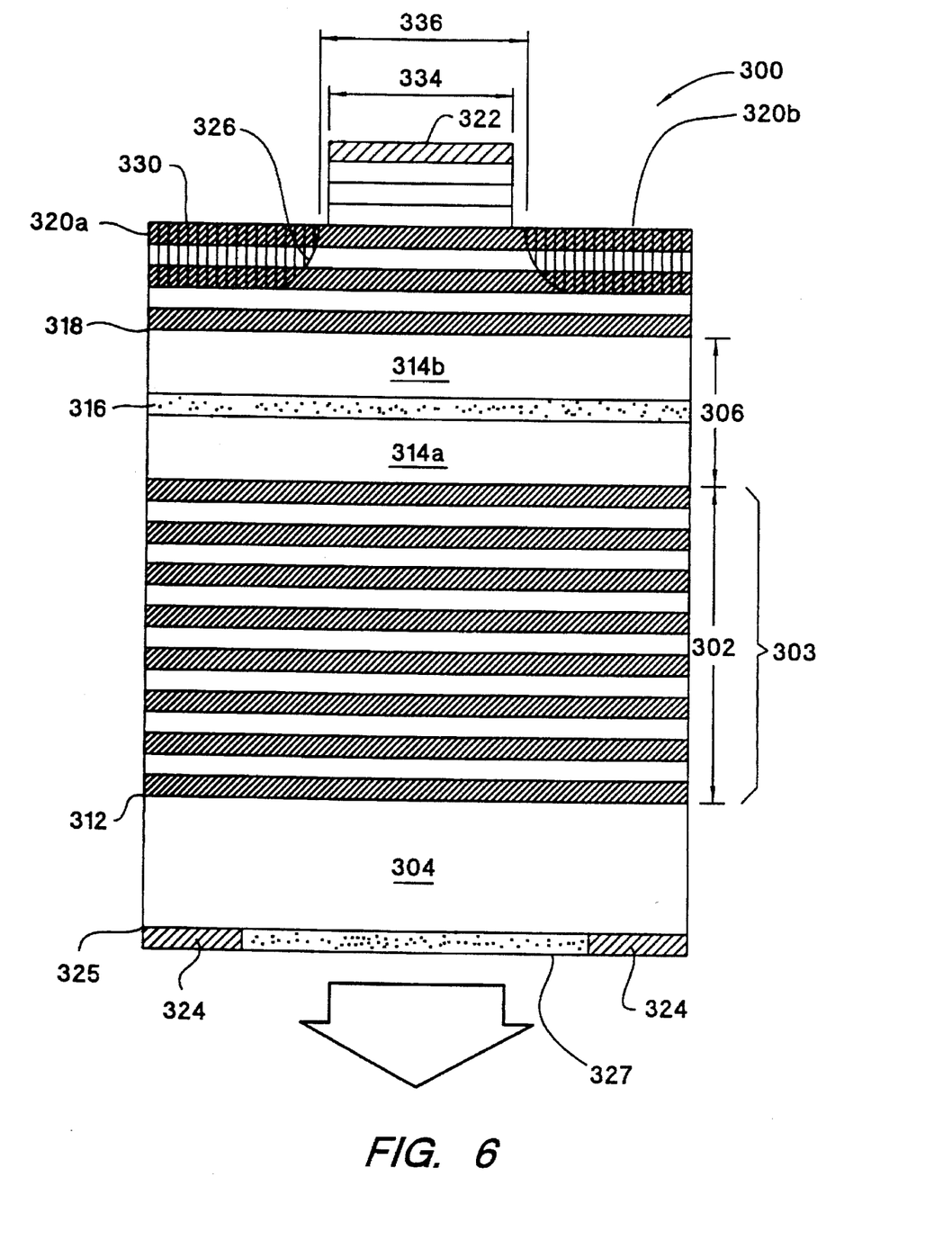
FIG. 6 shows a cross-sectional view of a bottom emitting multimode VCSEL structure according to an alternative embodiment of the present invention.

Referring to FIGS. 3 and 6, the width 334 defines the width of the top electrode 322. The width 336 defines the proton isolation region diameter, the distance between the two proton isolation regions 320a, 320b. Preferably the two proton isolation regions 320a, 320b are centered around the central axis of the electrode 322. In the embodiments shown in FIGS. 3 and 6, the proton isolation region diameter 336 is larger than the electrode width 334. This is in contrast to conventional single mode and multimode VCSELs where the proton isolation region diameter is either equal to or less than the electrode width.

FIG. 3 shows a cross-sectional view of a bottom emitting multimode VCSEL 300 according to a first embodiment of the present invention. FIG. 6 shows a cross-sectional view of a bottom emitting multimode VCSEL 500 according to an alternative embodiment of the present invention. In the embodiment shown in FIG. 3, the plane defining the top surface 330 of the proton isolation region 320 coincides with the plane defining the top surface 332 of the second Bragg mirror region 308 upon which an electrode 322 is formed. In the embodiment shown in FIG. 6, the top surface 332 of the second Bragg mirror region 308 is positioned above the top surface 330 of the proton isolation region 320, where the top surface 332 of the second Bragg mirror region 308 is generally parallel to the top surface 330 of the proton isolation region.

Figure 7:
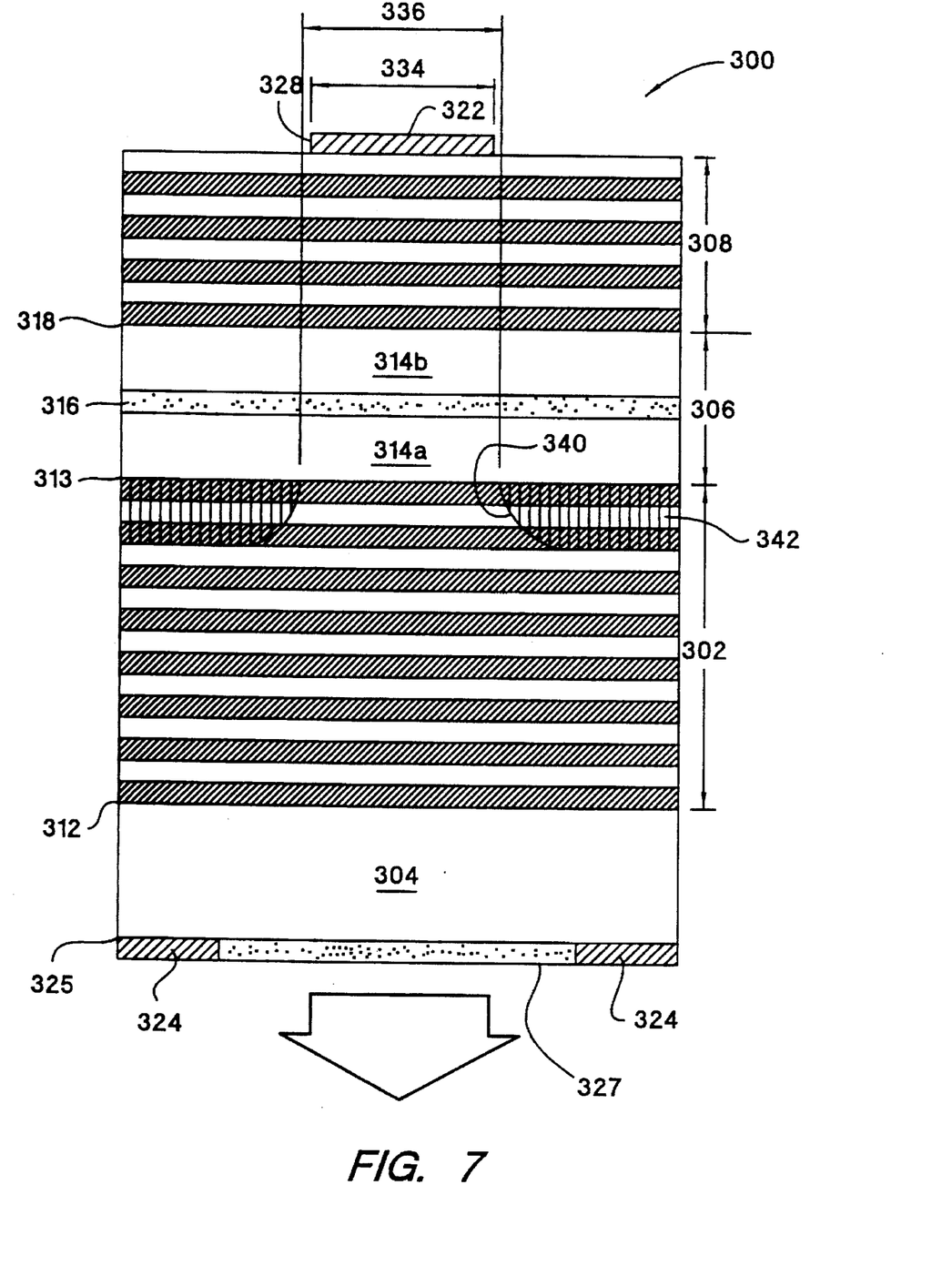
FIG. 7 shows a cross-sectional view of a bottom emitting multimode VCSEL structure according to an alternative embodiment of the present invention.

FIG. 7 shows a cross-sectional view of a bottom emitting multimode VCSEL structure according to an alternative embodiment of the present invention. In contrast to the embodiments shown in FIGS. 3 and 6 where the optical lossy region are proton implantation regions, in the embodiment shown in FIG. 7 the optical lossy region are formed using a buried oxygen implant. Oxygen implantation to form current constriction regions is described in U.S. Pat. No. 5,266,503. In the embodiment shown in FIG. 7, the oxygen implant is done in the first Bragg mirror region. The boundary 340 of the oxygen implant regions 342 is typically centered around the electrode. The distance between the oxygen implant regions 342 is typically greater than the electrode width 334.

Figure 8:
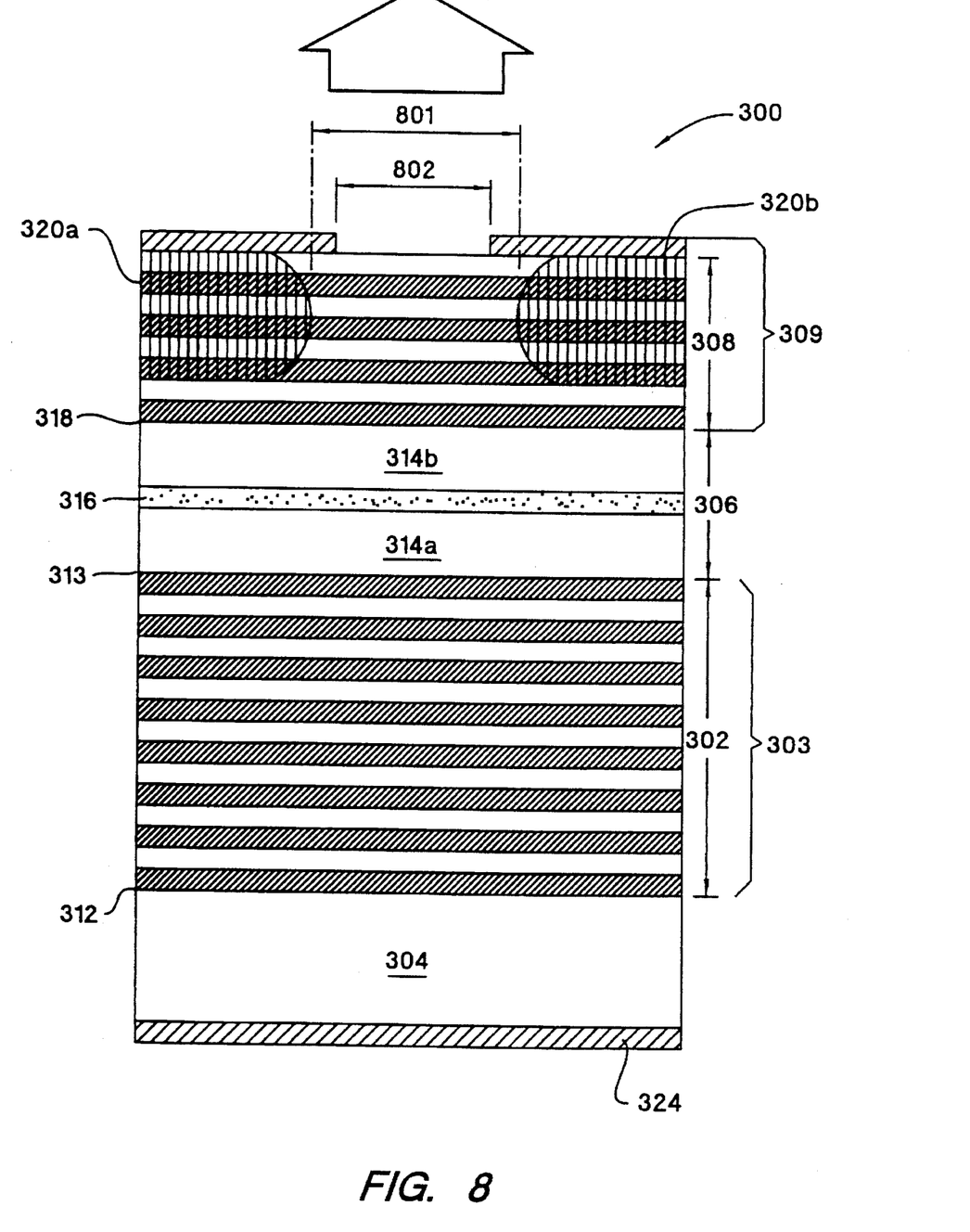
FIG. 8 shows a cross-sectional view of a top emitting multimode VCSEL according to an alternative embodiment of the present invention.

FIG. 8 shows a cross-sectional view of a top emitting multimode VCSEL according to an alternative embodiment of the present invention. Similar to the embodiments shown in FIGS. 3, 6 and 7, the lateral distance between the optically lossy regions 801 is greater than the lateral dimensions of the optical cavity, in this case defined approximately by 802. In the embodiment shown in FIG. 8, the distance between the sidewalls of the electrode 802 is less than the distance between the proton isolation regions 801. The output mirror reflectivity 308 is greater than 99.5% and the highest reflectivity mirror 302 is greater than 99.9%.

It should be noted that the multimode VCSEL shown in FIGS. 3 and 6–8 are not to scale. In particular, the first and second Bragg mirror regions 304, 308 and the active region 306 have been expanded to provide clarity in the drawings. For example, in practice the thickness of the substrate region 304 is approximately 150 µm as compared to about a 10 µm combined thicknesses of the Bragg mirror regions 302, 308, and the active regions 306. For the embodiments shown in FIG. 3 and 6, the electrode 322 is approximately 10 µm in diameter, while electrodes 324 form an opening of approximately 120–150 µm.

The method of making the multimode laser 300 according to the present invention includes the steps of: forming a first mirror region 302 on a substrate 304, the first mirror region 302 having a reflectivity greater than 99.5%; forming an active region 306 on the first mirror region 302; forming a second mirror region 308 on the surface of the active region 306, the second mirror region 308 having a reflectivity greater than 99.5%, the reflectivity of the first mirror region 302 and second mirror region 308 being designed such that the power output is less than half the maximum power output. Optically lossy regions are also typically formed. The distance between the optically lossy regions is greater than the lateral dimensions of the optical cavity of the multimode laser. For a bottom emitting laser, the boundary of the proton isolation region ends before the sidewalls of an electrode boundary of an electrode formed on the surface of the second mirror region. Preferably, the proton isolation region ends two to four microns before the sidewalls of the electrode.

In the embodiment shown in FIG. 3, a first surface 330 of the proton isolation region coincides with the surface 332 of the second mirror region 308. The step of forming the proton isolation region surface to coincide with the surface 332 of the second mirror region 308 further includes the steps of: forming a first mask layer on the surface 330 of the second mirror region 308. Typically, the first mask is an implant mask, the first material is a dopant comprised of H+ atoms and the second mirror region is exposed to the first material by ion implantation. Preferably H+ atoms having a dopant concentration of $10^{13}$ ions/cm$^2$ to $10^{15}$ ions/cm$^2$ are implanted.

After formation of the proton isolation regions 320, an electrode 322 is formed on the surface 332 of the second mirror region. Forming the electrode 322 includes the steps of: depositing a conductive layer, typically gold, on the surface of the second mirror region 308; forming a second mask on the surface of the second mirror region 308; removing a portion of the conductive layer to define the electrode 322; and removing the second mask.

The patterning techniques for formation of the proton isolation and electrode use methods well known in the art. However, unlike conventional single mode and multimode VCSELs where the implant mask (the first mask) and the etch mask (the second mask) may be a single mask, the method of making the a bottom emitting VCSEL according to the present invention typically uses two separate masks in order to form proton isolation regions a predetermined distance away (typically two to four microns) from the plane through the electrode sidewalls. This method is used for a top-emitting VCSEL, however, for a bottom-emitting VCSEL a self-aligning technique is used.

After removal of the second mask layer, methods well known in the art are used to connect the top electrode 322 and to form a bottom electrode 324. After removal of the second mask layer, Ti or Au is deposited for plating. This causes the Au contact to be plated for easy die attachment. Next, before formation of a contact 324 on a second surface 325 of the substrate 304, the substrate is thinned to approximately 4 to 6 mils. Typically the second contact is an ohmic contact made using techniques well known in the art. After formation of the contact 324, an anti-reflection layer 327 is typically deposited on the second surface of the substrate.

In contrast to the embodiment shown in FIG. 3, in the alternative embodiment shown in FIG. 6 the surface on which the top electrode 322 is formed does not coincide with the first surface of the proton isolation regions. The structure shown in FIG. 6 is done by performing a mesa etch in the second mirror region. Further, although in the preferred method the proton implant is performed before the mesa etch of the second mirror region, alternative the proton implant may be performed after the mesa etch. Further, although a proton implant improves multimode laser functionality, alternatively the proton implant step may be eliminated.

The multimode VCSEL structure shown in FIG. 6, preferably includes the steps of: forming a conductive layer, preferably gold (Au), is formed on the surface of the second mirror region; forming a proton isolation mask on the surface of the conductive layer; exposing the second mirror region to a first material; removing a portion of the conductive layer to form a first electrode; removing the proton isolation mask; forming a mesa etch mask; and removing a portion of the second mirror region, the second mirror region being removed to a first height.

After formation of the second mirror region, a conductive layer typically gold is deposited on the surface of the second mirror region. The conductive layer is used for electrode 322 formation. A proton isolation mask is formed on the conductive layer so that when exposed to an implant, typically of H+ ions having a dopant concentration in the range of $10^{13}$ ions/cm² to $10^{15}$ ions/cm². The implant step is followed by an undercutting etch step where the second mirror region is etched approximately a distance of greater than two microns. This is followed by an etch of approximately 0.4 microns of the second Bragg mirror region. The etch preferably should remove a portion of the second mirror region without totally removing the proton isolation region.

It is understood that the above description is intended to be illustrative and not restrictive. For example, although in the embodiments shown in FIGS. 3 and 5, the multimode laser is bottom emitting, this is not critical. Thus, the multimode laser may be top-emitting. Further, the number of DBR pairs and dopant concentrations for the top-emitting laser may vary. Further, different materials may be used and the number of DBR pairs to achieve the desired R (reflectivity). By way of example, the mirror regions may be made of other materials than AlAs and GaAs. For example AlAs and AlGaAs alternating layers may be used. Further, different methods may be used for manufacturing the multimode VCSELs shown in FIG. 3, and 6-8. Further other optically lossy regions than proton isolation regions may be used. Further, highly resistive regions such as native oxide may be used instead of optically lossy regions. The scope of the invention should therefore not be determined with reference to the above description, but instead should be determined with reference to the appended claims, along with the full scope of equivalents to which such claims are entitled.

What is claimed is:

1. A low noise multimode vertical cavity surface emitting laser comprised of:

a first mirror region, wherein the reflectivity of the first mirror is greater than 99.5%;

an active region positioned between the first mirror region and a second mirror region, wherein the reflectivity of the second mirror is greater than 99.5%, wherein the reflectivity of the first mirror region and the second mirror region are designed to result in an output power of the multimode vertical cavity surface emitting laser that is less than half the optimal power output; and a first optical lossy region and a second optical lossy region, wherein the distance between the first and second optical lossy regions is greater than the lateral dimensions of the optical cavity of the multimode laser, and further wherein the first and second optical lossy regions are positioned so that they do not significantly interfere with the outermost modes of the multimode vertical cavity surface emitting laser.

2. The multimode laser recited in claim 1 wherein the distance between a first vertical plane extending through the boundary of the first optical lossy region and a second vertical plane parallel to the first plane and extending through the boundary of the optical cavity is greater than two microns.

3. The multimode laser recited in claim 1 wherein the output power is less than 10% of the optimum output power.

4. The multimode laser recited in claim 1 wherein each mode of the multimode vertical cavity surface emitting laser has a different origination frequency, wherein the original frequencies of the different modes differ by less than 20%.

5. A low noise multimode vertical cavity surface emitting laser comprised of:

a first mirror region, wherein the reflectivity of the first mirror region is greater than 99.5%;

an active region positioned between the first mirror region and a second mirror region, the second mirror region being comprised of a second Bragg mirror region and an electrode having reflective properties formed on the surface of the second mirror region, wherein the reflectivity of the first mirror region is greater than 99.5% and the reflectivity of the second mirror region is greater than 99.5% and further wherein the reflectivity of the first mirror region and the second mirror region are designed to result in an output power of the multimode vertical cavity surface emitting laser that is less than half the maximum power output; and optical lossy regions formed in the second mirror region, wherein the distance between the optically lossy regions is greater than the lateral dimensions of the optical cavity of the multimode laser.

6. The multimode laser recited in claim 5 wherein the optically lossy regions are proton isolation regions.

7. The multimode laser recited in claim 6 wherein the distance between a first vertical plane extending through the boundary of the optically lossy region and a second vertical plane parallel to the first vertical plane and extending through the boundary of the optical cavity of the multimode vertical cavity surface emitting laser.

8. The multimode laser recited in claim 7 wherein the distance between the first vertical plane and the second vertical plane is greater than two microns.

9. The multimode laser recited in claim 7 wherein the plane defining the top surface of the proton isolation region coincides with the plane defining the top surface of the second Bragg mirror region on which the electrode is formed.

10. The multimode laser recited in claim 7 wherein the plane defining the top surface of the proton isolation region is positioned below the top surface of the second Bragg mirror region, the top surface of the second Bragg mirror region being generally parallel to the top surface of the proton isolation region.

11. The multimode laser recited in claim 6 wherein the distance between the proton isolation regions is greater than the width of the electrode formed on the surface of the second mirror region.

12. A method of making a multimode laser including the steps of:

forming a first mirror region on a substrate, the first mirror region having a reflectivity greater than 99.5%;

forming an active region on a first surface of the first mirror region;

forming a second mirror region on the surface of the active region, such that the active region is positioned between the first mirror region and the second mirror region, the second mirror region having a reflectivity greater than 99.5%, wherein the output power of the multimode vertical cavity laser is less than half the optimum output power; and forming a first and second optically lossy region, wherein the distance between the first and second optically lossy regions is greater than the lateral dimensions of the optical cavity, wherein the optical lossy regions are positioned so that the optically lossy regions do not significantly interfere with the outermost modes of the multimode vertical cavity surface emitting laser.

13. The method recited in claim 12 wherein the distance between the boundary of the first optically lossy region and the boundary of the optical cavity is greater than 2 microns.

* * * * *